United States Patent
Anderson et al.

(10) Patent No.: US 9,189,456 B2
(45) Date of Patent: Nov. 17, 2015

(54) TECHNIQUE FOR OPTIMIZATION AND RE-USE OF HARDWARE IN THE IMPLEMENTATION OF INSTRUCTIONS USED IN VITERBI AND TURBO DECODING, USING CARRY SAVE ARITHMETIC

(71) Applicants: Timothy D Anderson, Dallas, TX (US); Shriram D Moharil, Allen, TX (US)

(72) Inventors: Timothy D Anderson, Dallas, TX (US); Shriram D Moharil, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 229 days.

(21) Appl. No.: 13/916,810

(22) Filed: Jun. 13, 2013

(65) Prior Publication Data

US 2013/0275485 A1    Oct. 17, 2013

Related U.S. Application Data

(62) Division of application No. 12/874,653, filed on Sep. 2, 2010, now Pat. No. 8,554,823.

(51) Int. Cl.
| | |
|---|---|
| *G06F 7/50* | (2006.01) |
| *G06F 17/12* | (2006.01) |
| *H03M 13/39* | (2006.01) |
| *H03M 13/41* | (2006.01) |
| *H03M 13/00* | (2006.01) |

(52) U.S. Cl.
CPC .............. *G06F 17/12* (2013.01); *H03M 13/395* (2013.01); *H03M 13/3922* (2013.01); *H03M 13/4107* (2013.01); *H03M 13/6502* (2013.01); *H03M 13/6511* (2013.01); *H03M 13/6586* (2013.01)

(58) Field of Classification Search
CPC ....... G06F 7/509; G06F 7/5095; G06F 7/607; G06F 5/01; G06F 7/4991
USPC ........................................................ 708/709
See application file for complete search history.

(56) References Cited

U.S. PATENT DOCUMENTS

| | | | | |
|---|---|---|---|---|
| 4,839,850 A | * | 6/1989 | Noll et al. | ...... 708/709 |
| 5,426,598 A | * | 6/1995 | Hagihara | ...... 708/709 |

* cited by examiner

*Primary Examiner* — Tan V. Mai
(74) *Attorney, Agent, or Firm* — Robert D. Marshall, Jr.; Frank D. Cimino

(57) ABSTRACT

The present invention provides a means for optimization and re-use of hardware in the implementation of Viterbi and Turbo Decoders using carry save arithmetic. Successful provision for each target application requires that two main issues be confronted. These are: merging the computation of summation terms $(a2-b2+c2)$ with $(x2+y2+z2)$; and $(a3+b3-c3)$ with $(x3+y3+z3)$; implementing an efficient method of computing $(a4-b4-c4)$; and merging this computation with $(x4+y4+z4)$. The invention solves both of these issues and successfully merges the Viterbi instructions with a complete reuse of the hardware that is required for the implementation of Turbo instructions. The hardware required by both classes of instructions is optimized by efficiently employing carry save arithmetic.

3 Claims, 4 Drawing Sheets

TECHNIQUE FOR OPTIMIZATION AND RE-USE OF HARDWARE IN THE IMPLEMENTATION OF INSTRUCTIONS USED IN VITERBI AND TURBO DECODING, USING CARRY SAVE ARITHMETIC

This application is a divisional application of U.S. patent application Ser. No. 12/874,653 filed Sep. 2, 2010 entitled TECHNIQUE FOR OPTIMIZATION AND RE-USE OF HARDWARE IN THE IMPLEMENTATION OF INSTRUCTIONS USED IN VITERBI AND TURBO DECODING, USING CARRY SAVE ARITHMETIC.

TECHNICAL FIELD OF THE INVENTION

The technical field of this invention is forward error correction.

BACKGROUND OF THE INVENTION

Receivers capturing data can do so more efficiently if the data has been encoded allowing forward error correction. The Viterbi decoder uses the Viterbi algorithm for decoding a bitstream that has been encoded using Forward Error Correction based on a Convolutional code. The Viterbi algorithm is highly resource-consuming, but it does provide maximum likelihood decoding.

Viterbi decoders employ Trellis decoding to estimate the most likely sequence of events that lead to a particular state. U.S. patent application Ser. No. 12/496,538 filed Feb. 1, 2009 entitled "METHOD AND APPARATUS FOR CODING RELATING TO FORWARD LOOP" describes faster decoding in Viterbi decoders by employing 2 bits of the Trellis decoding to be performed using DSP instructions called R4ACS Radix-4 Add Compare Select (RACS4) and Radix-4 Add Compare Decision (RACD). This invention deals with the implementation of this class of DSP instructions.

Turbo codes are a type of forward error correction code with powerful capabilities. These codes are becoming widely used in many applications such as wireless handsets, wireless base stations, hard disk drives, wireless LANs, satellites, and digital television. A brief overview of Turbo decoders is summarized below.

A functional block diagram of a turbo decoder is shown in FIG. 1. This iterative decoder generates soft decisions from a maximum-a-posteriori (MAP) block using the probabilities represented by a-posteriori feedback terms $A_0$ 110 and $A_1$ 109. Each iteration requires the execution of two MAP decodes to generate two sets of extrinsic information. The first MAP decoder 102 uses the non-interleaved data as its input and the second MAP decoder 103 uses the interleaved data from the interleaver block 101.

The MAP decoders 102 and 103 compute the extrinsic information as:

$$W_n = \log \frac{Pr(x_n = 1 \mid R_1^n)}{Pr(x_n = 0 \mid R_1^n)} \quad (1)$$

where: $R_1^n = (R_0, R_1, \ldots R_{n-1})$ denotes the received symbols. The MAP decoders also compute the a posteriori probabilities:

$$Pr(x_n = i \mid R_1^n) = \frac{1}{Pr(R_1^n)} \Sigma Pr(x_n = i, S_n = m', S_{n-1} = m) \quad (2)$$

Here $S_n$ refers to the state at time n in the trellis of the constituent convolutional code.

The terms in the summation can be expressed in the form $$Pr(x_n = i, S_n = m', S_{n-1} = m) = \alpha_{n-1}(m) \gamma_n^i(m, m') \beta_n(m') \quad (3)$$

where the quantity $$\gamma_n^i(m, m') = Pr(S_n = m', x_n = i, R_n \mid S_{n-1} = m) \quad (4)$$

is called the branch metric, and $$\alpha_n(m') = Pr(S_n = m', R_1^n) \quad (5)$$

is called the forward (or alpha) state metric, and $$\beta(m') = Pr(R_{n+1}^n \mid S_n = m') \quad (6)$$

is called the backward (or beta) state metric.

The branch metric depends upon the systematic, parity, and extrinsic symbols. The extrinsic symbols for a given MAP decoder are provided by the other MAP decoder at inputs 109 and 110. The alpha and beta state metrics are computed recursively by forward and backward recursions given by $$\alpha_n(m') = \alpha_{n-1}(m) \gamma_n^i(m, m') \quad (7)$$

and $$\beta_{n-1}(m) = \sum_{m',i} \beta_n(m') \gamma_n'(m', m) \quad (8)$$

The slicer 107 completes the re-assembling of the output bit stream $x_0 \ldots x_{n-1}$ 108.

The block diagram of the MAP decoder is shown in FIG. 2. The subscripts r and f present the direction, reverse and forward, respectively, of the sequence of the data inputs for the recursive blocks beta and alpha. Input bit streams 210-212 and 213-215 are labeled as parameters $X_{n,r}$, $P_{n,r}$, $A_{n,r}$ and $X_{n,f}$, $P_{n,f}$, $A_{n,f}$ respectively. Feedback streams are labeled $\alpha_{n,f}$ and $\beta_{n,r}$.

Both the alpha state metric block 202 and beta state metric block 203 calculate state metrics. Both start at a known location in the trellis, the zero state. The encoder starts the block of n information bits (frame size n=5114) at the zero state and after n cycles through the trellis ends at some unknown state.

The mapping of this task of computing the branch metrics and adding to the previous state metrics, to a class of DSP instructions (T4MAX/T2MAX) is outside the scope of this invention. The current invention deals with the efficient implementation of this class of DSP instructions.

One of the main sources of latency in computer arithmetic is the propagation of carries in the computation of a sum of two or more numbers. This is a well-studied area, which is not explored here except to note that the best algorithms for addition require a number of logic levels equal to:

$$\text{levels} = 2 + \log_2 *(\text{width}) \quad (9)$$

where: width is the number of bits representing the numbers to be added.

FIG. 3 illustrates the three-to-two carry save circuit 302, otherwise known as the 3:2 CSA circuit, which takes three inputs 301 (*a*, *b* and *c*) and produces two outputs 303 (S and $C_O$). This circuit has the property that when S and $C_O$ are added together, they produce the same result as adding a+b+c. This process is often referred to as compressing the three numbers down to two numbers. The 3:2 CSA is sometimes referred to as a 3:2 compressor.

The three inputs can be any three bits, while the two outputs are the sum S and carry $C_O$ resulting from the addition of these three bits. These are computed based on the following logical equations:

$$S = a \oplus b \oplus c \quad (10)$$

$$C_O = (a*b) + (b*c) + (c*a) \quad (11)$$

The main advantage of using the 3:2 circuit is that equations (10) and (11) can typically be computed with a logic depth of no greater than 2. Thus it allows for faster computation of the sum of three numbers by preventing the carry from propagating. Therefore, given three numbers which need to be added together, rather than sequentially computing a+b=x, and then x+c, with a resulting delay $$\text{delay} = 2*(2 + \log_2*(\text{width})) \quad (12A)$$

one can process a+b+c through a 3:2 CSA compressor followed by an adder to achieve a total delay of:

$$\text{delay} = 4 + \log_2*(\text{width}) \quad (12B)$$

The savings in the number of logic level delays becomes even more pronounced when the width of the operands involved is large.

SUMMARY OF THE INVENTION

The present invention makes possible the optimization and re-use of hardware in the implementation of R4ACS Radix-4 Add Compare Select (RACS4) and Radix-4 Add Compare Decision (RACD) both classes of instructions for Viterbi decoders and T4MAX/T2MAX Turbo decoders using carry save arithmetic. Successful provision for these instructions requires merging the computation of summation terms and implementing an efficient method of computing.

The invention solves these issues and merges the R4ACS/R4ACD instructions with a complete reuse of the hardware that is required for the implementation of T2MAX/T4MAX instructions. The hardware required by both classes of instructions is optimized by efficiently employing carry save arithmetic.

The merged hardware includes a configurable three input arithmetic logic unit that can perform four arithmetic operations used by the max instructions. This invention uses 2's complement arithmetic and selective inversion to perform the four arithmetic operations a+b+c, a+b−c, a−b+c and a−b−c. These computations are used on inner terms of a max4 operation to facilitate circuit reuse in performing the operations in WiMAX radix-4 turbo decoders. A preferred embodiment employs carry-save adders in the three input arithmetic logic unit.

BRIEF DESCRIPTION OF THE DRAWINGS

These and other aspects of this invention are illustrated in the drawings, in which.

DETAILED DESCRIPTION OF PREFERRED EMBODIMENTS

R4ACS/R4ACD instructions used for implementing Viterbi decoding involve the following arithmetic computation:

$$R = \max 4*(a1+b1+c1, a2+b2-c2, a3-b3+c3, a4-b4-c4) \quad (13)$$

T2MAX/T4MAX Instructions used for Turbo decoders involve instructions requiring the following arithmetic computation:

$$R = \max 4*(x1+y1+z1, x2+y2+z2, x3+y3+z3, x4+y4+z4) \quad (14)$$

where: each of the terms compared can be N bits wide in general.

The following are the main issues in merging the two classes of instructions; merging the computation of summation terms (a2+b2−c2), (x2+y2+z2), (a3−b3+c3) and (x3+y3+z3); implementing an efficient method of computing for (a4−b4−c4); and merging this computation with (x4+y4+z4).

The present invention solves both of these issues and successfully merges the two classes of instructions. Furthermore, our invention optimizes the hardware required by both classes of instructions by efficiently employing carry save arithmetic.

Figure 1:
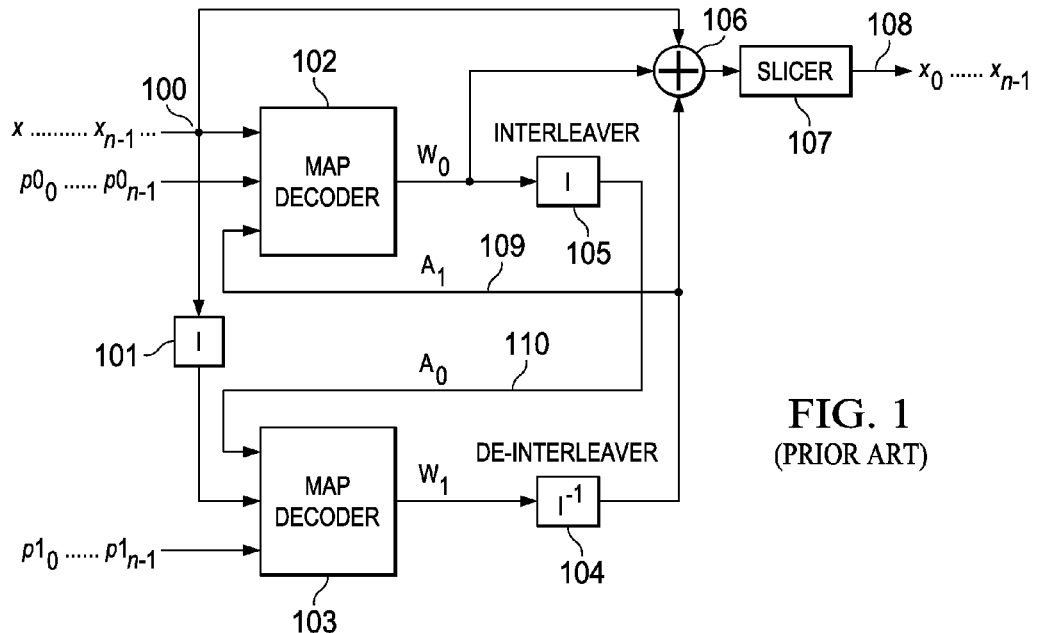
FIG. 1 illustrates the high-level block diagram of a Turbo decoder (Prior Art)
Figure 2:
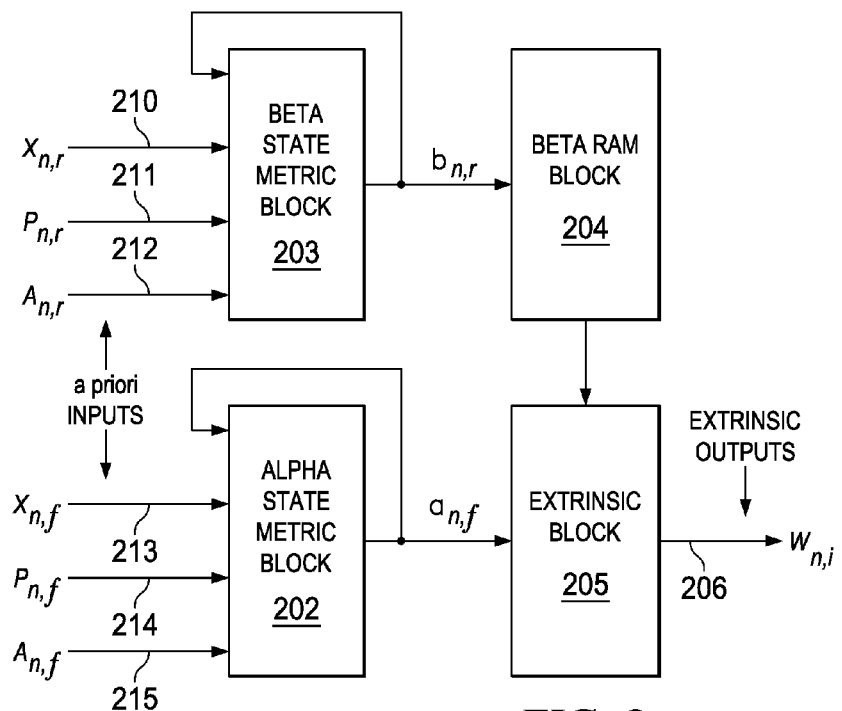
FIG. 2 illustrates the high-level block diagram of a MAP decoder (Prior Art)
Figure 3:
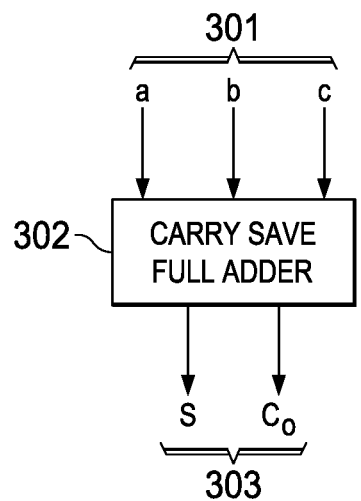
FIG. 3 illustrates the basic Carry Save Adder employed (Prior Art)
Figure 4:
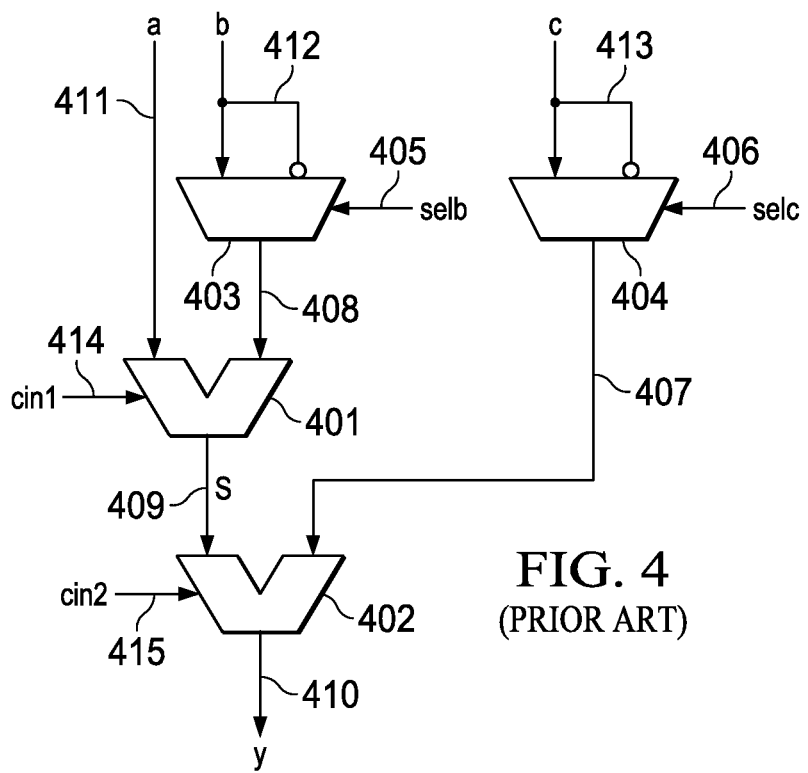
FIG. 4 illustrates the general approach of computing terms in Viterbi/Turbo instructions (Prior Art)

FIG. 4 illustrates the general approach for computing terms in the different instruction classes according to the prior art. The general approach toward computing each of the N bit wide terms for the instructions is to use two N-bit wide 2's complement adders 401 and 402 by using the associative property of addition.

The first term a 411 is 2's complement value and is a direct input to 2's complement adder 401 used to generate an intermediate result S 409. The second term b 412 passes through multiplexer 403, which generates b or the complement of b and passes the result to input 408 of adder 401. The third term c 413 is passes through multiplexer 404 to generate c or the complement of c and passes the result to input 407 of adder 401. Adder 402 with inputs 407 and 409 generates the final result y 410. The signals selb 405 and selc 406 control the 2:1 multiplexers 403 and 404 respectively. The signals cin1 414 and cin2 415 are the carry-in values to the least significant bit positions of the respective adder circuits. By appropriately setting the values of these signals as shown in Table 1, one can generate any of the four terms required by the Viterbi instructions.

TABLE 1

| selb | selc | cin1 | cin2 | y |
|------|------|------|------|-----------|
| 0 | 0 | 0 | 0 | a + b + c |
| 0 | 1 | 0 | 1 | a + b − c |
| 1 | 0 | 1 | 0 | a − b + c |
| 1 | 1 | 1 | 1 | a − b − c |

These settings are based on the following simple Boolean equation for computing the 2's complement:

$$-x = (\sim x) + 1 \quad (15)$$

where: ~x is the bit-wise complement of an N bit wide signal x; and −x is its additive inverse.

However, the approach of FIG. 4, while conceptually simple results in unacceptable worst-case delay. The present invention illustrated in FIG. 5 yields optimized delay results. The signals b and c are sent through multiplexer 500 controlled by selb signal 517 and multiplexer 507 controlled by selc signal 518 respectively to CSA 3:2 circuits 501 through 506. Note CSA 3:2 circuits 501 through 506 represent the appropriate number of carry save adder circuits for the implemented data width. Signal a passes directly to the CSA 3:2 circuits 501 through 506. These CSA 3:2 circuits generate sum 515 and carry 514 terms for each bit of the data width. These are input to the 2's complement adder 508 to generate the final result y consisting of sum output 516 and carry output 520. The signal cin2 is the carry input to the least significant bit (LSB) of the final 2's complement adder 508. Table 2 shows the values of the input selb, selc, cin1 and cin2 use generate the four terms required by the Viterbi instructions.

TABLE 2

| selb | selc | cin1 | cin2 | y |
|------|------|------|------|---|
| 0 | 0 | 0 | 0 | a + b + c |
| 0 | 1 | 0 | 1 | a + b − c |
| 1 | 0 | 0 | 1 | a − b + c |
| 1 | 1 | 1 | 1 | a − b − c |

The basic idea behind the generation of the first three terms in this approach is similar to the implementation in FIG. 4. The key difference is in the generation of the fourth term. This is achieved by rewriting the logic equation for this term as follows:

$$a-b-c = a+((\sim b)+1)+((\sim c)+1) \quad (16)$$

The signal cin2 can be set to provide the binary 1 that is required for generating the 2's complement of one of the inputs. The N-bit wide carry vector k generated by the 3:2 CSA circuits needs to be shifted to the left by one, prior to combining with the sum vector m, based on arithmetic weight. This leaves the carry bit from the 3:2 CSA circuit in the lowest bit position as an unused input. The signal cin1 is used to drive this input to add in the extra binary 1 that is required to generate the 2's complement for the other input. Thus all four terms required by the Viterbi instructions can be obtained using the hardware described in FIG. 5.

The total area consumed by the N 3:2 Carry Save circuits is typically much less than the N-bit wide adder that they replace, if one had chosen a carry-look-ahead or parallel-prefix adder which is optimized for performance. On the other hand, if one chooses an adder architecture based on chip area considerations (e.g. a ripple-carry adder), the delay through a 3:2 Carry Save circuit is much smaller in comparison. More important, this delay is constant and is independent of the width N of the operands involved, leading to even greater efficiency of this approach with regards to area and performance, as the width N of the operands increases.

Figure 5:
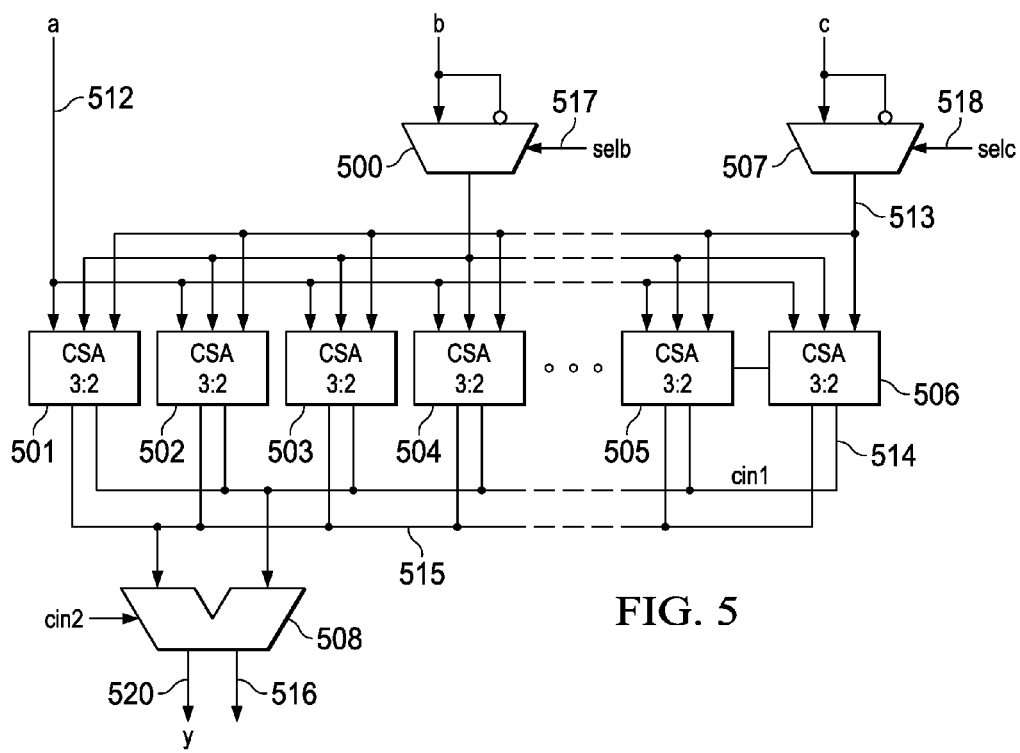
FIG. 5 illustrates the optimization and reuse of hardware across Viterbi/Turbo instructions using carry-save addition according to this invention.
Figure 6:
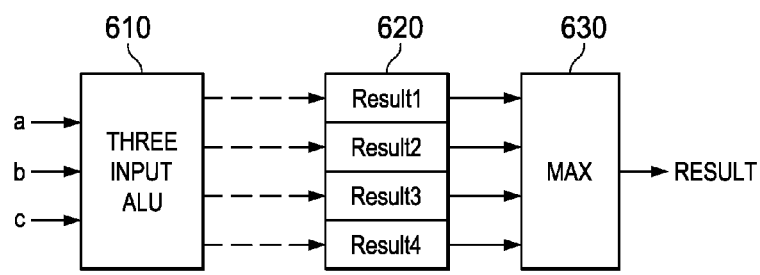
FIG. 6 illustrates using the three input arithmetic logic unit illustrated in FIG. 5 in forming the MAX4 function.

FIG. 6 illustrates using the three input arithmetic logic unit illustrated in either FIG. 4 or 5 in forming the MAX4 function discussed above. Three inputs a, b and c are supplied to three input ALU 610. As noted above the MAX4 function requires computation of a1+b1+c1, a2+b2−c2, a3−b3+c3 and a4−b4−c4. The four sets of operands (a1,b1,c1), (a2,b2,c2), (a3,b3,c3) and (a4,b4,c4) are sequentially supplied to the respective a, b and c inputs of three input ALU 610. These four operations are controlled as noted above to achieve the desired arithmetic combinations producing four results Result1, Result2, Result3 and Result4 stored in respective registers of register set 620. In a final operation the four results Result1, Result2, Result3 and Result4 are supplied to maximum block 630. Maximum block 630 selects the maximum of the four results Result1, Result2, Result3 and Result4 for output. This is the result R of equation (14).

The implementation of the MAX* computation function (such as noted above) in WiMAX CTC/3GPP radix-4 decoders is hardware intensive. Likewise, the hardware requirements in the implementation of certain low density parity check (LDPC) functions can be quite large. When designing circuits that implement both functions, it advantageous to minimize and efficiently reuse hardware in order to limit overall area and power requirements. This invention allows efficient reuse of the hardware required to implement both the MAX* and LDPC functions. Typically, the MAX* computation in the WiMAX decoders requires the following arithmetic computation:
1. result_max4=max4 $(a_0+b_0+c_0, a_1+b_1-c_1, a_2-b_2+c_2, a_3-b_3-c_3)$;
2. correction=maxabsdiff4$(a_0+b_0+c_0, a_1+b_1-c_1, a_2-b_2+c_2, a_3-b_3-c_3)$;
3. if ((correction>>threshold)>0)
   then correction=0,
   else correction=value;
4. result=result_max4+correction;

The MINST implementation for LDPC functions requires the following computation:
1. If x<y
   then min=x,
   else min=y;
2. If (min<0)
   then min=0;
3. If x<0
   then a=0,
   else a=x;
4. If y<0
   then b=0,
   else b=y;
5. sum=a+b;
6. dif=a−b;
7. if ((sum<threshold) AND (sum>−threshold))
   then offset1=value,
   else offset1=0;
8. if ((dif<threshold) AND (dif>−threshold))
   then offset2=value,
   else offset2=0;
9. z=min+offset1−offset2;

These two functions appear to be different since the nature of comparison of the threshold operands in the MINST is different from the computation of the terms in the max4 function of the MAX* function. This ordinarily implies that the hardware required to implement them cannot be shared. This invention further describes a manner for sharing hardware to implement these two functions.

The invention involves the following simple transformation to the MINST computation. The MINST function can be rewritten as:
1. If x<y
   then min=x,
   else min=y;
2. if (min<0)
   then min=0;
3. If x<0
   then a=0,
   else a=x';
4. If y<0
   then b=0,
   else b=y;

5. sum=a+b;
6. dif=a−b;
7. if ((a+b−threshold<0) AND (a+b+threshold>0))
   then offset1=value,
   else offset1=0;
8. if ((a−b−threshold<0) AND (a−b+threshold>0))
   then offset2=value,
   else offset2=0;
9. z=min+offset1−offset2;

This transforms the inner decisions in the range determinations of steps 7 and 8 into three input arithmetic operations with a compare to zero. Thus each term for the threshold comparison now resembles one of the three input arithmetic operations used in the max4 function almost exactly. The compare to zero portion of each inner decision is indicated by the three input ALU carry output 520. Much of the hardware required to implement these two functions can now be shared. This is an important area and power saving since each of the terms involved in this computation can be N bits wide in general.

Figure 7:
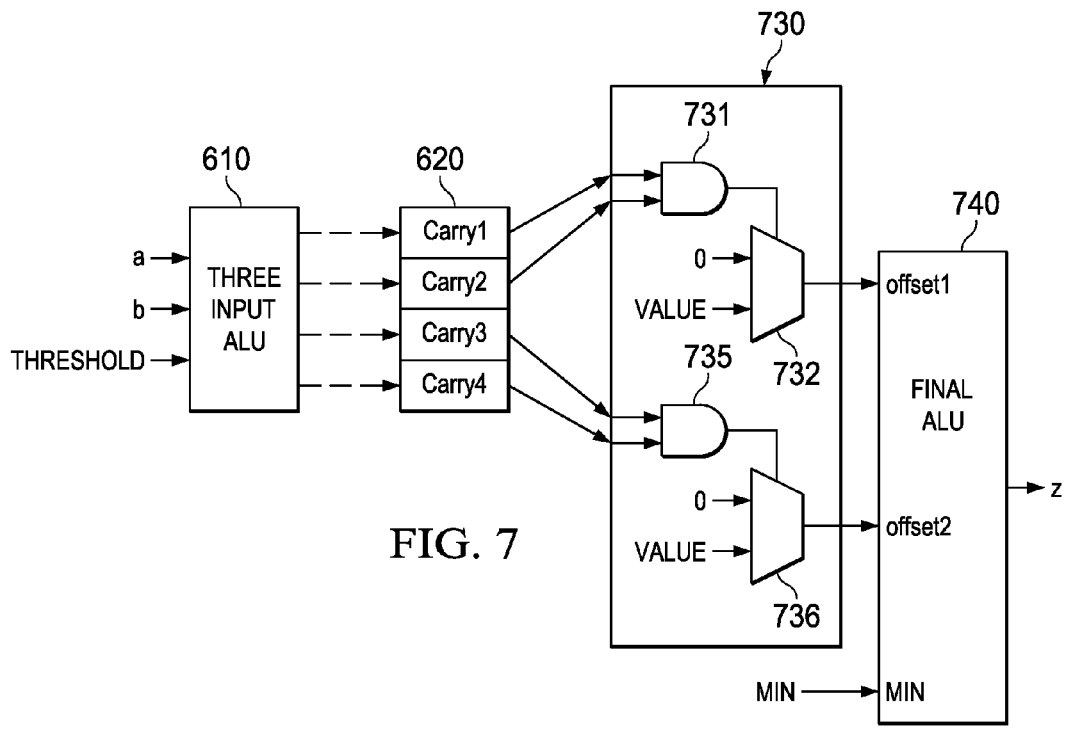
FIG. 7 illustrates using the three input arithmetic logic unit illustrated in FIG. 5 in forming the MINST function.

FIG. 7 illustrates using the three input arithmetic logic unit illustrated in either FIG. 4 or 5 in forming the MINST function discussed above. Three inputs a, b and c are supplied to three input ALU 610. As noted above the MINST function requires computation of a+b−threshold, a+b+threshold, a−b−threshold and a−b+threshold. The operands a, b and threshold are sequentially supplied to respective inputs of three input ALU 610. These four operations are controlled as noted above to achieve the desired arithmetic combinations. The compare to zero desired results come from the corresponding carry output 520. Register set 620 stores the corresponding outputs Carry1, Carry2, Carry3 and carry4 stored in respective registers.

Circuit 730 completes the range comparisons of steps 7 and 8. AND gate 731 forms the AND function of step 7 from the Carry1 and Carry2 values. Multiplexer 732 completes the "If . . . then . . . else" operation of step 7 by selecting value for offset1 if the range condition is satisfied and selecting 0 otherwise. AND gate 735 forms the AND function of step 8 from the Carry3 and Carry4 values. Multiplexer 736 completes the "If . . . then . . . else" operation of step 8 by selecting value for offset2 if the range condition is satisfied and selecting 0 otherwise.

The calculation of min in steps 1 and 2 is not on the critical path and thus can be done separately. Final ALU 740 performs the operation z=min+offset1−offset2 of step 9. This could be preformed by a further pass through three input ALU 610 or two passes through a normal two input ALU.

The final arithmetic operation (z=min+offset1−offset2) may be further simplified. Each of offset1 and offset2 can individually be "0" or "value" depending upon the respective range determinations. Their difference (offset1−offset2) is thus either be "0", "value" or "−value". Table 3 list these conditions.

TABLE 3

| Ranges | offset1 | offset2 | z |
|---|---|---|---|
| sum in range; difference in range | value | value | min |
| sum in range; difference out of range | value | 0 | min + value |
| sum out of range; difference in range | 0 | value | min − value |
| sum out of range; difference out of range | 0 | 0 | min |

Figure 8:
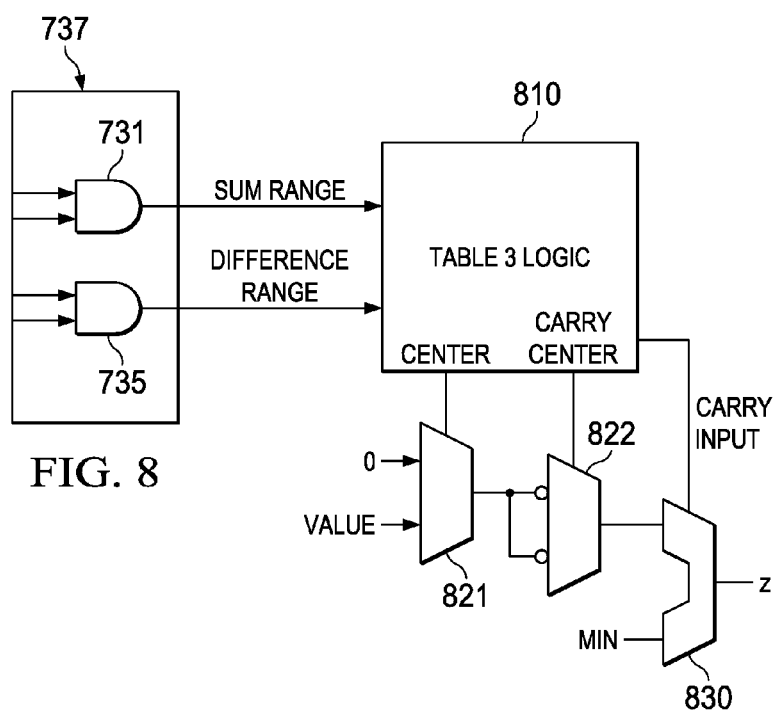
FIG. 8 illustrates an alternate embodiment to that illustrated in FIG. 7 for forming the output z.

FIG. 8 illustrates an alternate embodiment of this invention for forming the output z. Circuit 737 is an alternate to circuit 730. Circuit 737 includes AND gate 731 and AND gate 735 receiving respective Carry signals from register set 620 as previously illustrated in FIG. 7. AND gate 731 generates a sum range output indicating whether the sum a+b is within the range of step 7. AND gate 735 generates a difference range output indicating whether the difference a−b is within the range of step 8. Table 3 logic 810 controls multiplexers 821 and 822. One input of multiplexer 821 is "0." A second input of multiplexer 821 is value. Depending on the signal received at the control input multiplexer 821 supplies either "0" or value to its output. The selected output of multiplexer 821 supplies an inverting input and a non-inverting input of multiplexer 822. Table 4 lists the results of the selections of multiplexers 821 and 822 as controlled by Table 3 logic 810.

TABLE 4

| Ranges | Multiplexer 821 output | Multiplexer 822 output | Carry |
|---|---|---|---|
| sum in range; difference in range | 0 | 0 | 0 |
| sum in range; difference out of range | value | value | 0 |
| sum out of range; difference in range | value | ~value | 1 |
| sum out of range; difference out of range | 0 | 0 | 0 |

Multiplexer 822 takes advantage of 2's complement arithmetic and equation (15) to execute the subtraction by inversion and injection of a carry into ALU 830. ALU 830 performs the addition of min to form the result z.

The major advantage of this embodiment of the invention is that rearranging the inner calculations of the range decisions of steps 7 and 8 permits reuse of three input ALU 610 for performing the MINST function.

Compared to other solutions to the same problem, this solution offers better performance than other solutions requiring comparable chip area. In addition, reduced chip area can be achieved when compared with other solutions offering comparable performance. The solution offers efficient performance while keeping area requirements low. These benefits are further enhanced as the size of the operands involved increases, leading to greater scalability of this approach.

What is claimed is:

1. A configurable three input arithmetic logic unit forming a selectable combination of first, second and third multibit input data, comprising:
   a first multiplexer having a first input receiving said second multibit input data, a second inverting input receiving said second multibit input data, a control input and an output connected to said second input of said first multibit adder, said first multiplexer supplying said first input or said second input to said output dependent upon said control input;
   a second multiplexer having a first input receiving said third multibit input data, a second inverting input receiving said third input data, a control input and an output, said second multiplexer supplying said first input or said second input to said output dependent upon said control input; and
   a plurality of carry save adders disposed in a sequence between a least significant and a most significant, each carry save adder having a first input receiving corresponding bits of said first multibit input data, a second input connected to corresponding bits of said output of said first multiplexer, a third input connected to corresponding bits of said output of said second multiplexer, a least significant bit carry input, a sum output and a carry output, said least significant bit carry input of each of said plurality of carry save adders connected to a carry output of a most significant bit of a next least significant carry save adder, said carry input of a least significant carry save adder receiving a first carry input; and a multibit adder having a first input connected to said sum output of said plurality of carry save adders, a second input connected to said carry output of said plurality of carry save adders, a least significant bit carry input receiving a second carry input and an output forming an output of said configurable three input arithmetic logic unit.

2. The configurable three input arithmetic logic unit of claim 1, wherein:

said first multiplexer and said second multiplexer output said first input when said corresponding control input is 0;

said first multiplexer and said second multiplexer output said second input when said corresponding control input is 1;

said configurable three input arithmetic logic unit outputs said first multibit input data plus said second multibit input data plus said third multibit input data when said control input of said first multiplexer is 0, said control input of said second multiplexer is 0, said first carry input is 0 and said second carry input is 0;

said configurable three input arithmetic logic unit outputs said first multibit input data plus said second multibit input data minus said third multibit input data when said control input of said first multiplexer is 0, said control input of said second multiplexer is 1, said first carry input is 0 and said second carry input is 1;

said configurable three input arithmetic logic unit outputs said first multibit input data minus said second multibit input data plus said third multibit input data when said control input of said first multiplexer is 1, said control input of said second multiplexer is 0, said first carry input is 0 and said second carry input is 1; and said configurable three input arithmetic logic unit outputs said first multibit input data minus said second multibit input data minus said third multibit input data when said control input of said first multiplexer is 1, said control input of said second multiplexer is 1, said first carry input is 1 and said second carry input is 1.

3. The configurable three input arithmetic logic unit of claim 1, wherein:

said first multibit input data, said second multibit input data and said third multibit input data are expressed as 2's complement values; and said multibit adder is a 2's complement adder.

* * * * *